(12) United States Patent
Liu

(10) Patent No.: US 7,087,937 B2
(45) Date of Patent: Aug. 8, 2006

(54) LIGHT EMITTING DIODE (LED) PACKAGING

(75) Inventor: Chia Chi Liu, Taipei (TW)

(73) Assignee: Lustrous Technology Ltd., Taipei (TW)

(*) Notice: Subject to any disclaimer, the term of this patent is extended or adjusted under 35 U.S.C. 154(b) by 0 days.

(21) Appl. No.: 11/184,971

(22) Filed: Jul. 20, 2005

(65) Prior Publication Data
US 2006/0049420 A1 Mar. 9, 2006

(30) Foreign Application Priority Data
Sep. 3, 2004 (TW) .............................. 93126783 A

(51) Int. Cl.
*H01L 29/22* (2006.01)
*H01L 23/10* (2006.01)

(52) U.S. Cl. .................. 257/99; 257/100; 257/706; 257/708; 257/720; 257/675; 257/722; 257/E33.056; 257/E33.058; 257/E33.075

(58) Field of Classification Search ................ 257/99, 257/100, 706, 708, 720, 675, 722, E33.056, 257/E33.058, E33.075; 438/122, 125; 361/760, 361/764
See application file for complete search history.

(56) References Cited

U.S. PATENT DOCUMENTS

2004/0156597 A1* 8/2004 Kaneko ....................... 385/88
2004/0246877 A1* 12/2004 Ishizaki et al. ......... 369/112.23

* cited by examiner

*Primary Examiner*—Kenneth Parker
*Assistant Examiner*—Joseph Nguyen
(74) *Attorney, Agent, or Firm*—Troxell Law Office, PLLC

(57) ABSTRACT

A light emitting diode (LED) packaging comprising a stacked substrate, a main body, and an LED die is provided. The stacked substrate includes a heat spreader and a first circuit board. The first circuit board is stacked on the heat spreader. Two channels penetrate the first circuit board and the heat spreader. An upper opening of the channel is smaller than a lower opening thereof. The main body is formed on the first circuit board and has a through hole to expose part of the first circuit board. The main body further has at least two extended portion filling the channels for fixing the main body on the stacked substrate. The LED die is located in the through hole and electrically connected to the first circuit board.

23 Claims, 5 Drawing Sheets ic # LIGHT EMITTING DIODE (LED) PACKAGING

BACKGROUND OF THE INVENTION (1) Field of the Invention

This invention relates to a light emitting diode (LED) packaging, and more particularly to a high brightness LED packaging with a heat spreader.

(2) Description of Related Art

Light emitting diodes (LEDs) are small solid-state illuminators, which transform electric energy to cold illumination with high efficiency. The LED is a semiconductor pn junction diode specified with a pn junction surface. When a voltage is applied to the pn junction, electrons and holes are segregated toward the pn junction surface and then combined to release photons.

FIG. 1 shows a cross-section view of a traditional LED packaging 100. The LED packaging 100 includes a LED die 120, an anode metal lead 160, and a cathode metal lead 140. The LED die 120 is located on the top of the anode metal lead 160 and electrically connected to the cathode metal lead 140 by using a conductive wire 180. In addition, a transparent plastic body 190, which may be formed of resin, encapsulates the LED die 120 for protection.

Basically, the illumination of the LED die 120 is positively proportional to the current passing through the pn junction surface within the LED die 120. The density of the current has a limitation to prevent the pn junction surface from being breakthrough. Thus, it is understood that for applying a greater current to the LED die 120, the pn junction surface area must be increased. However, as the traditional LED packaging 100 shown in FIG. 1 is concerned, the greater current is attending with a huge amount of heat segregated in the LED packaging and reduces the illumination efficiency of the LED die 120.

Accordingly, how to release the heat generated in the LED packaging by the great current passing through the pn junction has become an important issue of high illumination LED industry.

SUMMARY OF THE INVENTION

A main object of the present invention is to provide a light emitting diode (LED) packaging by using heat spreader for releasing the heat generated by the LED die.

The LED packaging in the present invention is characterized with a flip-chip packaged LED die.

The light emitting diode (LED) packaging provided in the present invention comprises a stacked substrate, a main body, and an LED die. The stacked substrate includes a heat spreader and a first circuit board. The first circuit board is stacked on the heat spreader. At least two channels penetrate the first circuit board and the heat spreader. An upper opening of the channel is smaller than a lower opening thereof. The main body is formed on the first circuit board and has a through hole to expose part of the first circuit board. The main body further has at least two extended portion filling the channels for fixing the main body on the stacked substrate. The LED die is located in the through hole and electrically connected to the first circuit board.

Reference will now be made in detail to the preferred embodiments of the present invention, examples of which are illustrated in the accompanying drawings. Wherever possible, the same reference numbers will be used throughout the drawings to refer to the same or like parts.

BRIEF DESCRIPTION OF THE DRAWINGS

The present invention will now be specified with reference to its preferred embodiment illustrated in the drawings, in which.

DETAIL DESCRIPTION OF THE PREFERRED EMBODIMENTS

Figure 1:
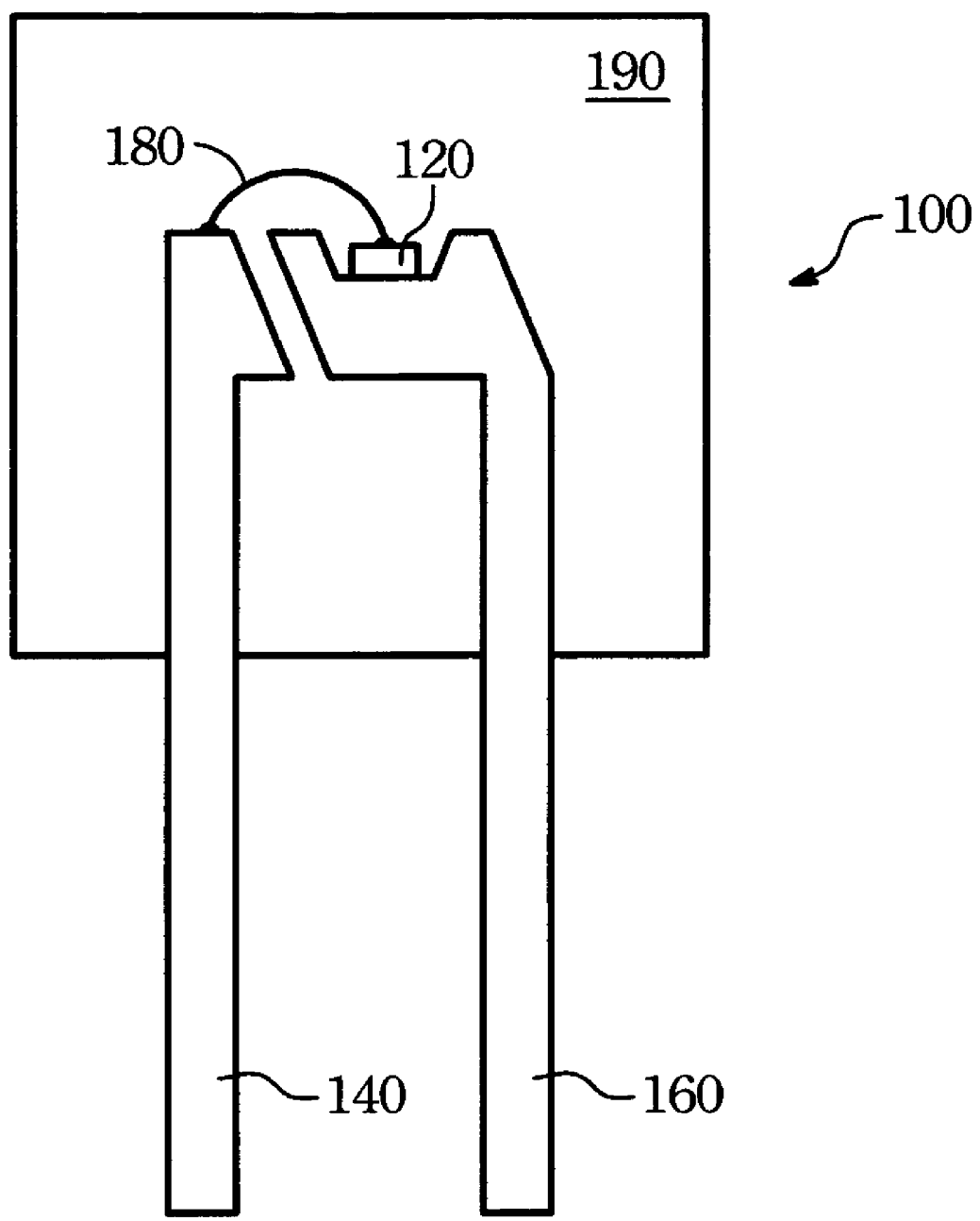
FIG. 1 depicts a cross-section view of a traditional LED packaging.
Figure 2A:
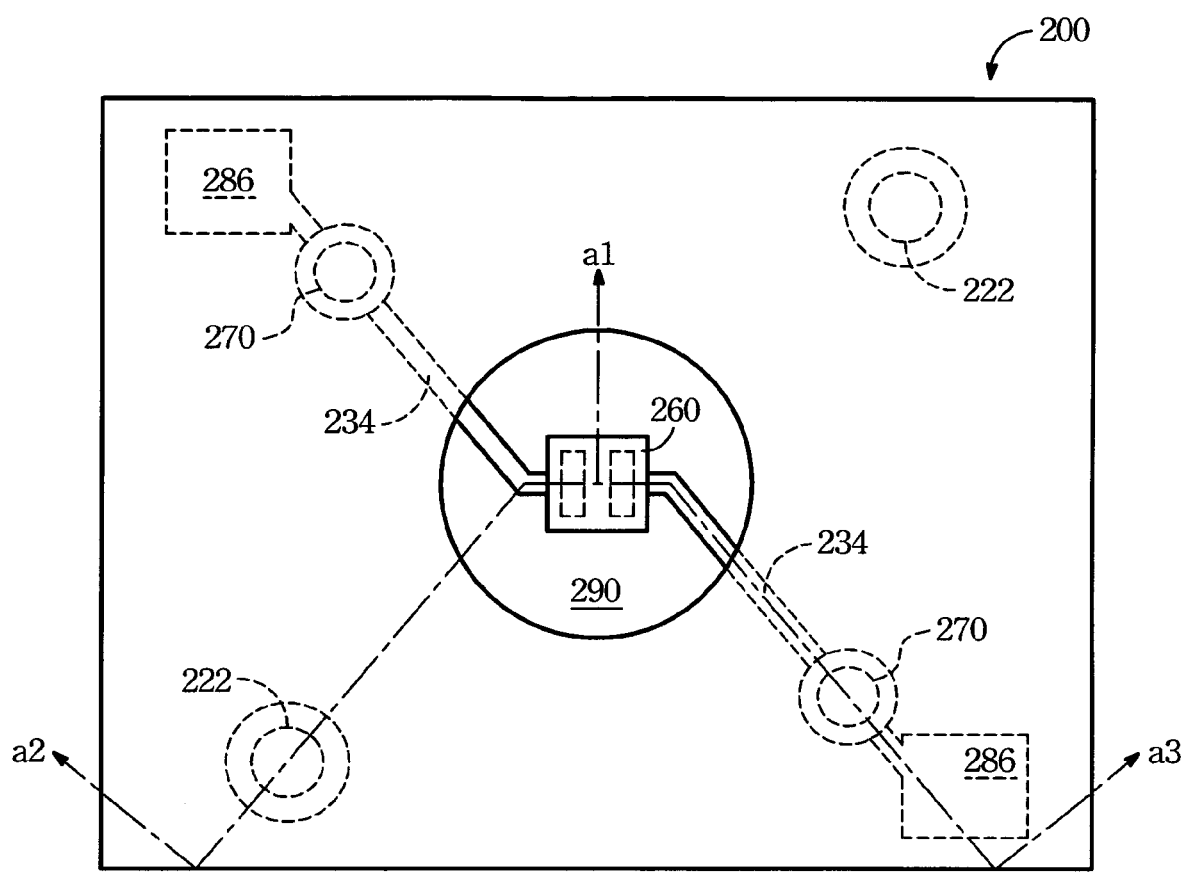
FIG. 2A depicts a top view of a first preferred embodiment of the LED packaging in accordance with the present invention.
Figure 2B:
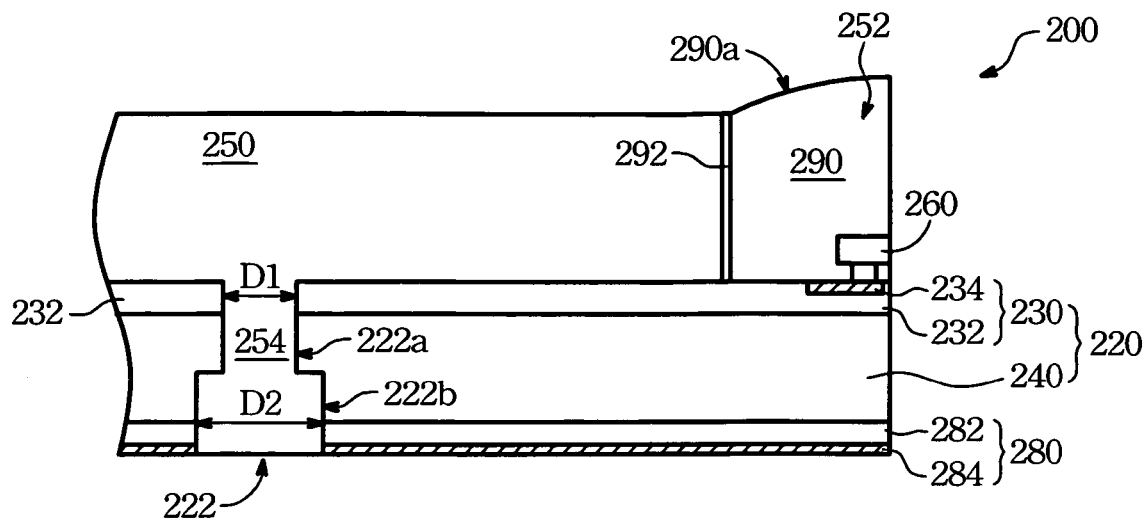
FIG. 2B depicts a cross-section view of a1–a2 cross section with respect to FIG. 2A.
Figure 2C:
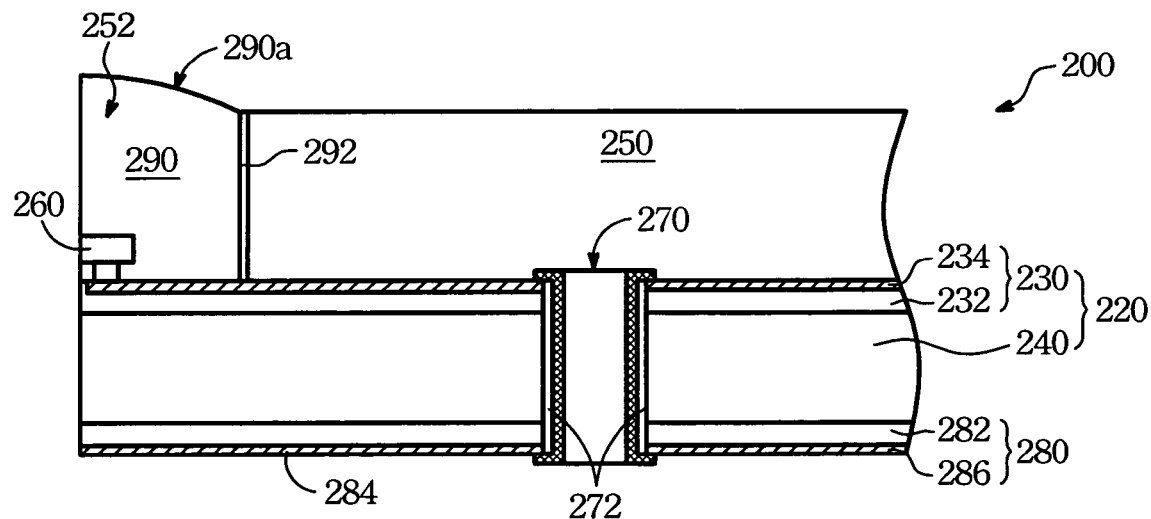
FIG. 2C depicts a cross-section view of a1–a3 cross section with respect to FIG. 2A.

FIG. 2A shows a top view of a light emitting diode (LED) packaging in accordance with the present invention. FIGS. 2B and 2C are cross-section views with respect to a1–a2 and a1–a3 cross-section surfaces of FIG. 2A. As shown, the LED packaging 200 in accordance with the present invention includes a stacked substrate 220, a main body 250, and an LED die 260.

The stacked substrate 220 includes a heat spreader 240 and a first circuit board 230. The first circuit board 230 is stacked on the heat spreader 240. For providing a good thermal conductive efficiency, the heat spreader 240 may be formed of high thermal conductive metal material, such as copper, aluminum, and etc. Still referring to FIG. 2B, the stacked substrate 220 further has two channels 222 penetrating the first circuit board 230 and the heat spreader 240. Each channel is divided into an upper cylindrical portion 222a and a lower cylindrical portion 222b. The upper cylindrical portion 222a and the lower cylindrical portion 222b are connected with each other and have a common axis. Moreover, the diameter D1 of the upper cylindrical portion 222a is smaller then the diameter D2 of the lower cylindrical portion 222b.

The main body 250 is formed on an upper surface of the first circuit board 230 and has a through hole 252 to expose part of the first circuit board 230. The main body 250 further has two extending portions 254 located besides the through hole 252 and filling the two channels 222 respectively. It should be noted that the main body 250 and the extending portions 254 inside the channels are simultaneously formed together of plastic material by injecting molding. As a preferred embodiment, the plastic material may be polyphthalamide (PPA) doped with ceramic powder, such as titanium dioxide (TiO2) powder, for increasing thermal conductive efficiency. It is understood that although the plastic material cannot effectively adhere on the metal material, the plastic extending portions 254 still can be kept inside the channels 222 because that the diameter D1 of the upper cylindrical portion 222a is smaller than the diameter D2 of the lower cylindrical portion 222b. That is, the extending portions 254 are utilized to fix the main body 250 on the stacked substrate 220.

In addition, it is also understood that by having the upper opening of the channel 222 smaller than the lower opening thereof, the extending portion 254 filling the channel 222 can be left inside the channel 222 to fix the main body 250 on the stacked substrate 220.

The LED die 260 is located in the through hole 252 within the main body 250, and it is assembled on the first circuit board 230 by using flip-chip technology. The first circuit board 230 includes an insulating substrate 232 and a conductive pattern 234. The conductive pattern 234 is formed on the insulating substrate 232 and electrically connected to the LED die 260 through two contact pads. For applying voltage to the LED die 260, as shown in FIG. 2C, two conductive plugs 270 are formed inside the stacked substrate 220 and penetrate the stacked substrate 220. In addition, the two conductive plugs 270 are electrically connected to the anode and the cathode of the LED die 260 through the conductive pattern 234 on the first circuit board 230.

Moreover, a second circuit board 280 is formed on a bottom surface of the heat spreader 240. The second circuit board 280 includes an insulating substrate 282 and a conductive pattern 284 formed on a bottom surface of the insulating substrate 282. The conductive pattern 284 has two contact pads 286 electrically connected to the lower edge of the two conductive plugs 270 respectively for applying voltages to the LED die 260. It should be noted that in order to reduce electric power consumption, the two conductive plugs 270 had better be formed of high conductive metal material, such as copper or aluminum. However, the heat spreader 240 is also composed of metal material. Thus, an insulating film 272 is demanded to cover the sidewall of the conductive plug 270 for electrically insulating the conductive plugs 270 and the heat spreader 240.

In addition, a transparent layer 290 is formed to fill the through hole 252 of the main body 250 and covers the LED die 260. As a preferred embodiment shown in FIG. 2B, the transparent layer 290 has a convex upper surface 290a for concentrating the illumination of the LED die 260. In order to increase the illumination efficiency, a sidewall of the through hole 252 may be plated with a reflecting layer 292 to prevent the lateral dissipation of illumination.

Figure 3:
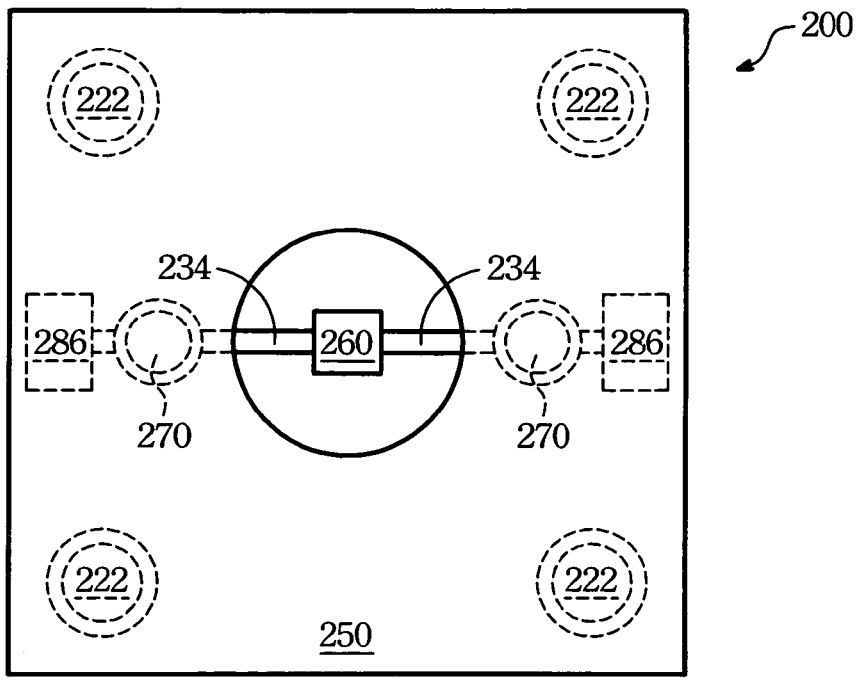
FIG. 3 depicts a top view of a second preferred embodiment of the LED packaging in accordance with the present invention.

FIG. 3 shows a top view of a second preferred embodiment of the LED packaging 200 in accordance with the present invention. By contrast to the embodiment of FIG. 2A with only two channels 222 arranged at the opposing sides with respect to the LED die 260, the present embodiment has four channels 222 located at the corners of the stacked substrate (not labeled in this figure) to make sure the main body 250 is firmly fixed on the upper surface of the stacked substrate.

Figure 4:
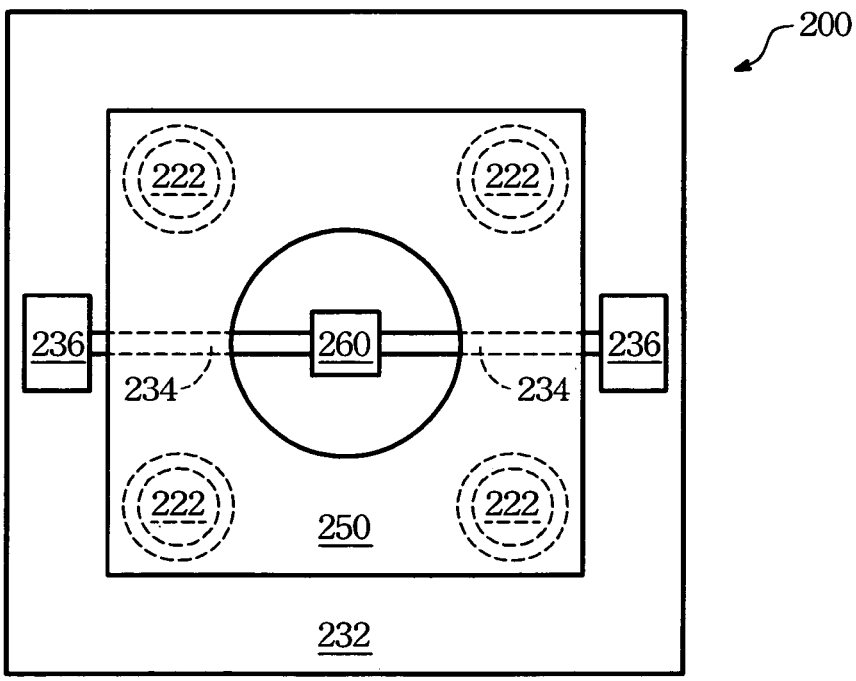
FIG. 4 depicts a top view of a third preferred embodiment of the LED packaging in accordance with the present invention.

FIG. 4 shows a top view of a third preferred embodiment of the LED packaging 200 in accordance with the present invention. By contrast to the embodiment of FIG. 2A with contact pads 286 formed on the bottom surface of the heat spreader 240 for providing the anode and the cathode voltages to the LED die 260, the conductive pattern 234 of the first circuit board (not labeled in this figure) in the present embodiment has two contact pads 236 located on the upper surface and near the edges of the insulating substrate 232 of the first circuit board for providing the anode and the cathode voltages to the LED die 260.

Figure 5:
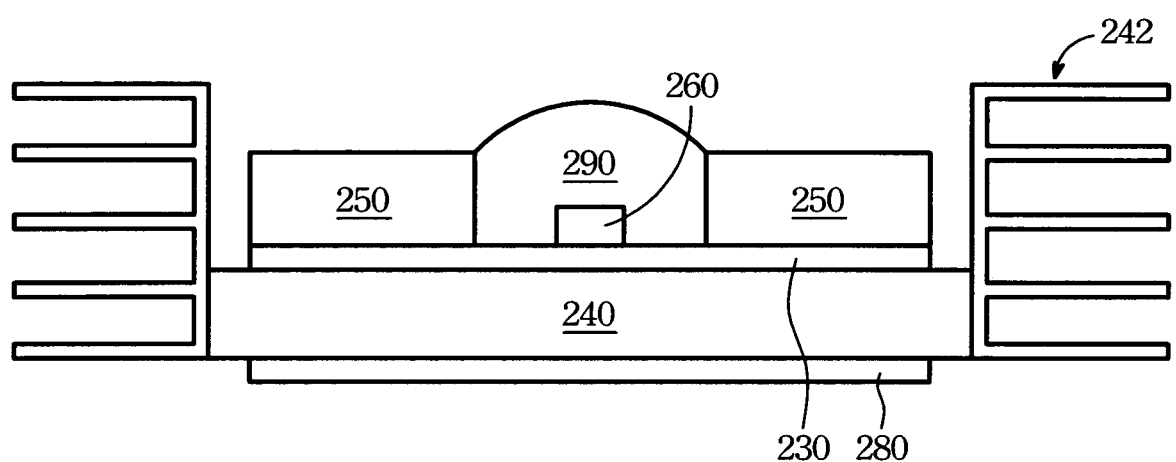
FIG. 5 depicts a cross-section view of a fourth preferred embodiment of the LED packaging in accordance with the present invention.

FIG. 5 shows a cross-section view of a fourth preferred embodiment of the LED packaging in accordance with the present invention. A plurality of thermal conductive fins 242 is formed on the sidewalls of the heat spreader 240 for providing better thermal dissipation efficiency.

The LED packaging in accordance with the present invention has the following advantages:

Firstly, the stacked substrate 220 includes a first circuit board 230 and a heat spreader 240, wherein the first circuit board 230 is utilized for flip-chip packaging the LED die 260, and the heat spreader 240 is utilized for providing a thermal dissipation path to remove the heat generated by the LED die 260 downward.

Secondly, referring to FIG. 2B, the main body 250 is formed on the stacked substrate 220 by injecting molding to reduce the fabrication cost. It should be noted that the channels 222 inside the stacked substrate 220 are firmly adapted to the extending portions 254 for fixing the main body 250 on the upper surface of the stacked substrate 220.

Thirdly, as shown in FIG. 2C, the anode and cathode voltages of the LED die 260 may be simply provided from the contact pads 286 on the second circuit board 280 under the heat spreader 240 through the conductive plugs 270.

Fourthly, as shown in FIG. 4, the anode and cathode voltages of the LED die 260 may be simply provided from the contact pads 236 on the first circuit board 230 on the heat spreader 240.

With the example and explanations above, the features and spirits of the invention will be hopefully well described. Those skilled in the art will readily observe that numerous modifications and alterations of the device may be made when retaining the teaching of the invention. Accordingly, the above disclosure should be construed as limited only by the metes and bounds of the appended claims.

What is claimed is:

1. A light emitting diode (LED) packaging comprising:
   a stacked substrate, including a heat spreader and a first circuit board stacked on the heat spreader, the stacked substrate having at least two channels penetrating the first circuit board and the heat spreader, and an upper opening of the channels smaller than a lower opening thereof;
   a main body, formed on the first circuit board, having a through hole to expose part of the first circuit board, the main body having at least two extended portions filling the channels for fixing the main body; and
   an LED die located in the through hole and electrically connected to the first circuit board.

2. The LED packaging of claim 1 wherein the LED die is assembled on the first circuit board by using flip-chip technology.

3. The LED packaging of claim 1 wherein the channel is divided into an upper cylindrical portion and a lower cylindrical portion, the upper cylindrical portion is connected to the lower cylindrical portion, and the diameter of the upper cylindrical portion is smaller than that of the lower cylindrical portion.

4. The LED packaging of claim 1 wherein the first circuit board includes an insulating substrate and a conductive pattern formed on an upper surface of the insulating substrate.

5. The LED packaging of claim 4 wherein the conductive pattern is formed of copper sheet.

6. The LED packaging of claim 4 further comprising two conductive plugs penetrating the stacked substrate and connecting to the conductive pattern.

7. The LED packaging of claim 4 wherein the conductive pattern comprising two contact pads connected to an anode and a cathode of the LED die.

8. The LED packaging of claim 6 further comprising a second circuit board formed on a bottom surface of the heat spreader and electrically connected the first circuit board through the conductive plugs.

9. The LED packaging of claim 8 wherein the second circuit board includes an insulating substrate and a conductive pattern formed on a lower surface of the insulating substrate.

10. The LED packaging of claim 9 wherein the conductive pattern is formed of copper sheet.

11. The LED packaging of claim 8 wherein the conductive pattern has two contact pads electrically connecting to the conductive plugs.

12. The LED packaging of claim 6 wherein the conductive plugs are covered with an insulating film for electrically insulating the conductive plugs and the heat spreader.

13. The LED packaging of claim 6 wherein the conductive plugs are formed of copper or aluminum.

14. The LED packaging of claim 1 wherein the main body is composed of plastic material.

15. The LED packaging of claim 14 wherein the main body is formed by using injecting molding.

16. The LED packaging of claim 14 wherein the main body is doped with titanium dioxide powder.

17. The LED packaging of claim 1 wherein the heat spreader is formed of metal material.

18. The LED packaging of claim 1 wherein the heat spreader is formed of copper and aluminum.

19. The LED packaging of claim 1 wherein the two channels are arranged at the opposing sides with respect to the LED die.

20. The LED packaging of claim 1 further comprising a transparent layer filling the opening of the main body and covering the LED die.

21. The LED packaging of claim 1 wherein the transparent layer having a convex upper surface.

22. The LED packaging of claim 1 wherein a sidewall of the opening is plated with a reflecting layer.

23. The LED packaging of claim 1 further comprising a thermal conductive fin connecting to the heat spreader.

* * * * *